United States Patent
White et al.

(10) Patent No.: US 11,124,746 B2
(45) Date of Patent: Sep. 21, 2021

(54) POST CMP CLEANING COMPOSITION

(71) Applicant: ENTEGRIS, INC., Billerica, MA (US)

(72) Inventors: Daniela White, Ridgefield, CT (US); Michael White, Ridgefield, CT (US); Jun Liu, Newtown, CT (US); Elizabeth Thomas, New Milford, CT (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 16/659,471

(22) Filed: Oct. 21, 2019

(65) Prior Publication Data
US 2020/0148979 A1 May 14, 2020

Related U.S. Application Data

(60) Provisional application No. 62/757,364, filed on Nov. 8, 2018.

(51) Int. Cl.
| | |
|---|---|
| *C11D 7/32* | (2006.01) |
| *C11D 11/00* | (2006.01) |
| *C11D 3/00* | (2006.01) |
| *C11D 3/30* | (2006.01) |
| *B08B 3/08* | (2006.01) |
| *C11D 1/62* | (2006.01) |
| *C11D 1/58* | (2006.01) |
| *C11D 1/90* | (2006.01) |
| *H01L 21/02* | (2006.01) |
| *C11D 3/28* | (2006.01) |

(52) U.S. Cl.
CPC ............ *C11D 11/0047* (2013.01); *B08B 3/08* (2013.01); *C11D 1/58* (2013.01); *C11D 1/62* (2013.01); *C11D 1/90* (2013.01); *C11D 3/0047* (2013.01); *C11D 3/0073* (2013.01); *C11D 3/28* (2013.01); *C11D 3/30* (2013.01); *H01L 21/02057* (2013.01)

(58) Field of Classification Search
CPC .................................................. C11D 11/0047
USPC ......................................................... 510/175
See application file for complete search history.

(56) References Cited

U.S. PATENT DOCUMENTS

| | | | |
|---|---|---|---|
| 2008/0125342 A1 | 5/2008 | Visintin | |
| 2010/0112728 A1* | 5/2010 | Korzenski | C09K 13/08 438/3 |
| 2010/0167972 A1 | 7/2010 | Kawase | |
| 2012/0283163 A1* | 11/2012 | Barnes | C11D 7/329 510/175 |
| 2015/0114429 A1* | 4/2015 | Jenq | C11D 7/3209 134/2 |
| 2015/0307818 A1 | 10/2015 | Barnes | |
| 2016/0075971 A1* | 3/2016 | Liu | C23G 1/18 510/175 |

(Continued)

*Primary Examiner* — Gregory E Webb
(74) *Attorney, Agent, or Firm* — Entegris, Inc.

(57) ABSTRACT

The disclosure generally relates to a composition and process for cleaning residue and/or contaminants from microelectronic devices having said residue and contaminants thereon. The residue may include post-CMP, post-etch, and/or post-ash residue. The compositions and methods are particularly advantageous when cleaning a microelectronic surface comprising copper, low-k dielectric materials, and barrier materials comprising at least one of tantalum-containing material, cobalt-containing material, tantalum-containing, tungsten-containing, and ruthenium-containing material.

19 Claims, 2 Drawing Sheets

(56) References Cited

U.S. PATENT DOCUMENTS

| | | |
|---|---|---|
| 2016/0340620 A1* | 11/2016 | Sun .................. H01L 21/02063 |
| 2017/0200601 A1 | 7/2017 | Song |
| 2018/0037852 A1* | 2/2018 | Thomas ............ H01L 21/02063 |
| 2018/0204736 A1* | 7/2018 | White ....................... C09G 1/16 |
| 2018/0291309 A1* | 10/2018 | Frye ......................... C11D 3/30 |
| 2019/0177671 A1* | 6/2019 | Parson ................. C11D 3/2096 |
| 2020/0024554 A1* | 1/2020 | White .................. C11D 7/3218 |
| 2020/0071642 A1* | 3/2020 | Thomas .................. C11D 3/33 |

* cited by examiner

POST CMP CLEANING COMPOSITION

FIELD OF THE INVENTION

The present invention relates generally to compositions for cleaning residue and/or contaminants from microelectronic devices having same thereon.

BACKGROUND OF THE INVENTION

Microelectronic device wafers are used to form integrated circuits. The microelectronic device wafer includes a substrate, such as silicon, into which regions are patterned for deposition of different materials having insulative, conductive or semi-conductive properties.

In order to obtain the correct patterning, excess material used in forming the layers on the substrate must be removed. Further, to fabricate functional and reliable circuitry, it is often important to prepare a flat or planar microelectronic wafer surface prior to subsequent processing. Thus, it is necessary to planarize and/or polish certain surfaces of a microelectronic device wafer.

Chemical Mechanical Polishing or Planarization ("CMP") is a process in which material is removed from a surface of a microelectronic device wafer, and the surface is planarized and polished by coupling a physical process such as abrasion with a chemical process such as oxidation or chelation. In its most rudimentary form, CMP involves applying slurry, e.g., a solution of an abrasive and an active chemistry, to a polishing pad that buffs the surface of a microelectronic device wafer to achieve the removal, planarization, and polishing processes. It is not typically desirable for the removal or polishing process to be comprised of purely physical or purely chemical action, but rather the synergistic combination of both in order to achieve fast, uniform removal. In the fabrication of integrated circuits, the CMP slurry should also be able to preferentially remove films that comprise complex layers of metals and other materials so that highly planar surfaces can be produced for subsequent photolithography, patterning, etching and thin-film processing.

In copper damascene processes commonly used for metallization of circuitry in microelectronic device fabrication, the layers that must be removed and planarized include copper layers having a thickness of about 1-1.5 µm and copper seed layers having a thickness of about 0.05-0.15 µm. These copper layers are separated from the dielectric material surface by a layer of barrier material, typically about 50-300 Å thick, which prevents diffusion of copper into the oxide dielectric material. One key to obtaining good uniformity across the wafer surface after polishing is to use a CMP slurry that has the correct removal selectivities for each material.

Tantalum and tantalum nitride are currently used as barrier layer material to prevent device contamination caused by copper diffusing through the dielectric layer. However, it is difficult to deposit copper effectively onto the barrier layer due to the high resistivity of tantalum, especially in high-aspect ratio features. Consequently, a copper seed layer has to be initially deposited onto the barrier layer. As the feature size of the circuits are being reduced to the 65 nm, 45 nm and 32 nm scale, controlling the precise thickness of the seed layer to prevent overhang at the top of the trenches and the formation of voids becomes extremely difficult, especially for 32 nm technology node and beyond.

The foregoing processing operations, involving wafer substrate surface preparation, deposition, plating, etching and chemical mechanical polishing, variously require cleaning operations to ensure that the microelectronic device product is free of residue and contaminants that would otherwise deleteriously affect the function of the product, or even render it useless for its intended function. Often, particles of these contaminants are smaller than 0.3 µm. Following CMP processing, such residues and contaminants include CMP slurry components, particles from the removed layers, and corrosion inhibitor compounds such as benzotriazole (BTA). If not removed, these residues can cause damage to copper lines or severely roughen the copper metallization, as well as cause poor adhesion of post-CMP applied layers on the device substrate. Severe roughening of copper metallization is particularly problematic, since overly rough copper can cause poor electrical performance of the product microelectronic device.

There is a continuing need in the industry to provide compositions and methods that effectively remove residues and contaminants from a substrate, including substrates that include barrier materials other than, or in addition to tantalum and tantalum nitride. The compositions and methods should eliminate particles and other contaminants on the copper or cobalt as well as not corrode, or otherwise damage the copper or cobalt.

SUMMARY OF THE INVENTION

The present invention generally relates to a composition and process for cleaning residue and/or contaminants from microelectronic devices having said residue and contaminants thereon. The residue may include post-CMP, post-etch, and/or post-ash residue. The compositions and methods are particularly advantageous when cleaning a microelectronic surface comprising copper or cobalt, low-k dielectric materials, and barrier materials comprising at least one of tantalum-containing material, cobalt-containing material, titanium-containing, tungsten-containing, and ruthenium-containing material.

In one aspect, a cleaning composition is provided, said composition comprising (i) at least one etchant material chosen from amines and complexing agents, (ii) at least one cleaning additive chosen from ethylene oxide/propylene oxide block copolymers, dodecyl trimethyl ammonium hydroxide, Cocamidopropyl Betaine, polyglycol ethers, and fatty amine quaternary ammonium salts, and combinations thereof, (iii) at least one organic additive, (iv) at least one corrosion inhibitor, (v) at least one pH adjuster, and optionally (vi) at least one water soluble polymer, wherein said composition has a pH of greater than about 8.

In another aspect, the invention provides a method for removing residue and contaminants from a microelectronic device having said residue and contaminants thereon, said method comprising contacting the microelectronic device with the cleaning compositions of the invention for sufficient time to at least partially clean said residue and contaminants from the microelectronic device. The compositions of the invention are advantageously compatible with copper, low-k dielectric materials, and barrier materials, wherein the barrier materials comprise at least one of tantalum-containing material, cobalt-containing material, or ruthenium-containing material.

DETAILED DESCRIPTION OF THE INVENTION

Figure 1:
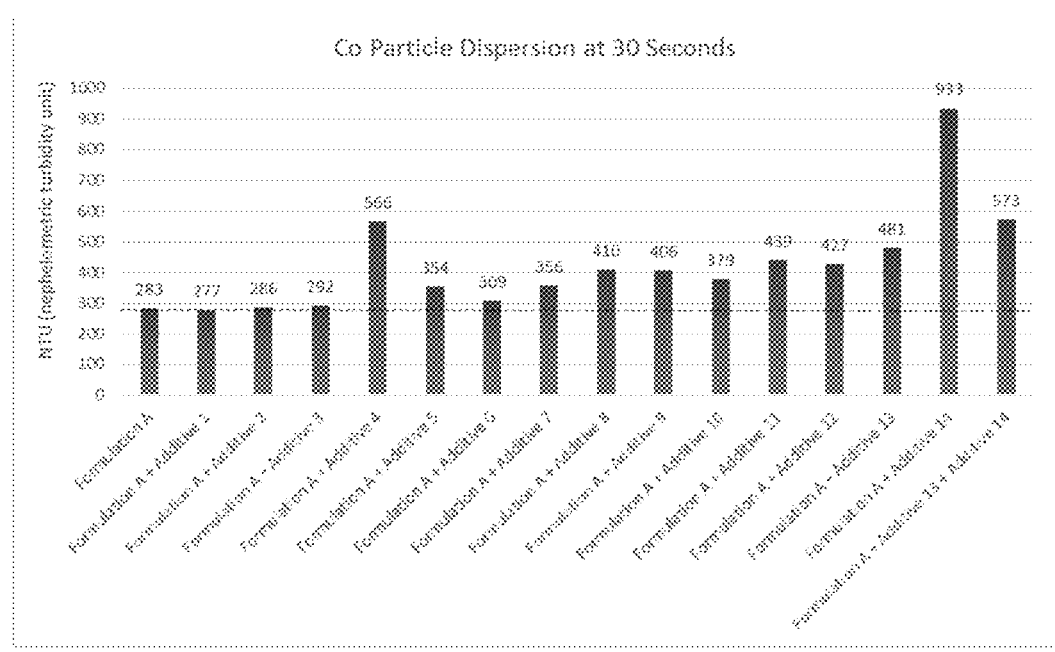
FIGS. 1 and 2 is a plot of NTU (nephelometric turbidity unit) versus time (seconds) for a variety of cleaning compositions of the invention.

The present invention relates generally to compositions useful for the removal of residue and contaminants from a microelectronic device having such material(s) thereon. The compositions are particularly useful for the removal of post-CMP, post-etch or post-ash residue.

For ease of reference, "microelectronic device" corresponds to semiconductor substrates, flat panel displays, phase change memory devices, solar panels and other products including solar substrates, photovoltaics, and microelectromechanical systems (MEMS), manufactured for use in microelectronic, integrated circuit, or computer chip applications. Solar substrates include, but are not limited to, silicon, amorphous silicon, polycrystalline silicon, monocrystalline silicon, CdTe, copper indium selenide, copper indium sulfide, and gallium arsenide on gallium. The solar substrates may be doped or undoped. It is to be understood that the term "microelectronic device" is not meant to be limiting in any way and includes any substrate that will eventually become a microelectronic device or microelectronic assembly.

As used herein, "residue" corresponds to particles generated during the manufacture of a microelectronic device including, but not limited to, plasma etching, ashing, chemical mechanical polishing, wet etching, and combinations thereof.

As used herein, "contaminants" correspond to chemicals present in the CMP slurry, reaction by-products of the polishing slurry, chemicals present in the wet etching composition, reaction by products of the wet etching composition, and any other materials that are the by-products of the CMP process, the wet etching, the plasma etching or the plasma ashing process. A common contaminant includes benzotriazole, which is often present in the CMP slurry.

As used herein, "post-CMP residue" corresponds to particles from the polishing slurry, e.g., silica-containing particles, chemicals present in the slurry, reaction by-products of the polishing slurry, carbon-rich particles, polishing pad particles, brush deloading particles, equipment materials of construction particles, metals, metal oxides, organic residues, barrier layer residues, and any other materials that are the by-products of the CMP process. As defined herein, the "metals" that are typically polished include copper, cobalt, aluminum, ruthenium, iron, titanium, and tungsten.

As defined herein, "low-k dielectric material" corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities.

As defined herein, the term "barrier material" corresponds to any material used in the art to seal the metal lines, e.g., copper interconnects, to minimize the diffusion of said metal, e.g., copper, into the dielectric material. Preferred barrier layer materials include tantalum, titanium, ruthenium, hafnium, tungsten, cobalt, and nitrides, carbides, and silicides of any of the foregoing metals.

As defined herein, "post-etch residue" corresponds to material remaining following gas-phase plasma etching processes, e.g., BEOL dual damascene processing, or wet etching processes. The post-etch residue may be organic, organometallic, organosilicic, or inorganic in nature, for example, silicon-containing material, carbon-based organic material, and etch gas residue such as oxygen and fluorine.

As defined herein, "post-ash residue," as used herein, corresponds to material remaining following oxidative or reductive plasma ashing to remove hardened photoresist and/or bottom anti-reflective coating (BARC) materials. The post-ash residue may be organic, organometallic, organosilicic, or inorganic in nature.

"Substantially devoid" is defined herein as less than 2 wt. %, preferably less than 1 wt. %, more preferably less than 0.5 wt. %, and most preferably less than 0.1 wt. %. In one embodiment, "substantially devoid" corresponds to zero percent.

As defined herein, "ruthenium-containing material" and "ruthenium species" includes, but is not limited to, pure ruthenium, ruthenium nitrides (including ruthenium nitrides comprising additional elements such as Si, Ta or Li), ruthenium oxides (including ruthenium oxides comprising hydroxides), and ruthenium alloys. It should be understood by the person skilled in the art that the chemical formula for the various ruthenium oxides and nitrides can vary based on the oxidation state of the ruthenium ion, wherein the common oxidation states of ruthenium are 0, +2, +3, +4, +6, +7, +8 or −2.

As defined herein, "tantalum-containing material" and "tantalum species" includes, but is not limited to, pure tantalum, tantalum nitrides (including tantalum nitrides comprising additional elements such as Si), tantalum oxides (including tantalum oxides comprising hydroxides), tantalum aluminides, and tantalum alloys. It should be understood by the person skilled in the art that the chemical formula for the various tantalum oxides and nitrides can vary based on the oxidation state of the tantalum ion, wherein the common oxidation states of tantalum are −1, −3, +1, +2, +3, +4 and +5.

As defined herein, "cobalt-containing material" and "cobalt species" includes, but is not limited to, pure cobalt, cobalt oxide, cobalt hydroxide, (including cobalt nitrides comprising additional elements such as Ta or Ti), tantalum oxides, CoW, CoP, CoSi, and cobalt silicide. It should be understood by the person skilled in the art that the chemical formula for the various cobalt oxides and nitrides can vary based on the oxidation state of the cobalt ion, wherein the common oxidation states of cobalt are −3, −1, +1, +2, +3, +4, and +5.

As defined herein, "ruthenium-containing material" and "ruthenium species" includes, but is not limited to, pure ruthenium, ruthenium nitrides (including ruthenium nitrides comprising additional elements such as Si, Ta or Li), ruthenium oxides (including ruthenium oxides comprising hydroxides), and ruthenium alloys. It should be understood by the person skilled in the art that the chemical formula for the various ruthenium oxides and nitrides can vary based on the oxidation state of the ruthenium ion, wherein the common oxidation states of ruthenium are 0, +2, +3, +4, +6, +7, +8 or −2.

As used herein, "about" is intended to correspond to ±5% of the stated value.

As defined herein, "reaction or degradation products" include, but are not limited to, product(s) or byproduct(s) formed as a result of catalysis at a surface, oxidation, reduction, reactions with the compositional components, or that otherwise polymerize; product(s) or byproduct(s) formed as a result of a change(s) or transformation(s) in which a substance or material (e.g., molecules, compounds, etc.) combines with other substances or materials, interchanges constituents with other substances or materials, decomposes, rearranges, or is otherwise chemically and/or physically altered, including intermediate product(s) or byproduct(s) of any of the foregoing or any combination of the foregoing reaction(s), change(s) and/or transformation(s). It should be appreciated that the reaction or degradation products may have a larger or smaller molar mass than the original reactant.

The etchant sources assist in breaking up and solubilizing the post-etch residue species, aiding in polymer sidewall residue removal. Etchant sources contemplated herein include, but are not limited to: certain amines and complexing agents.

As used herein, "complexing agent" includes those compounds that are understood by one skilled in the art to be complexing agents, chelating agents and/or sequestering agents. Complexing agents will chemically combine or coordinate with or physically hold the metal atom and/or metal ion to be removed using the compositions described herein. Complexing agents include species having the general formula $NR^1R^2R^3$, wherein $R^1$, $R^2$ and $R^3$ may be the same as or different from one another and are chosen from hydrogen, straight-chain or branched $C_1$-$C_6$ alkyl (e.g., methyl, ethyl, propyl, butyl, pentyl, and hexyl) groups, straight-chain or branched $C_1$-$C_6$ hydroxyalkyl (e.g., hydroxymethyl, hydroxyethyl, hydroxypropyl, hydroxybutyl, hydroxypentyl, and hydroxyhexyl) groups, and $C_1$-$C_6$ alkyl ethers of straight chain or branched $C_1$-$C_6$ hydroxyalkyl groups as defined above. In certain embodiments, at least one of $R^1$, $R^2$ and $R^3$ is a straight-chain or branched $C_1$-$C_6$ hydroxyalkyl group. Examples include, without limitation, alkanolamines such as aminoethylethanolamine, N-methylaminoethanol, aminoethoxyethanol, dimethylaminoethoxyethanol, diethanolamine, N-methyldiethanolamine, monoethanolamine (MEA), diethanolamine, triethanolamine (TEA), 1-amino-2-propanol, 2-amino-1-butanol, isobutanolamine, triethylenetetramine, ethylenediamine, tetraethylenepentamine, dimethylethanolamine, N-methylpropanolamine, diisopropanolamine, diglycolamine, diethyleneglycolhydroxyethylamine ethylene triethylenediamine, other $C_1$-$C_8$ alkanolamines and combinations thereof. When the amine includes the alkylether component, the amine may be considered an alkoxyamine, e.g., 1-methoxy-2-aminoethane. Alternatively, or in addition to the $NR^1R^2R^3$ amine, the complexing agent may be a multifunctional amine including, but not limited to, 4-(2-hydroxyethyl)morpholine (HEM), 1,2-cyclohexanediamine-N,N,N', N'-tetraacetic acid (CDTA), ethylenediaminetetraacetic acid (EDTA), (hydroxyethyl)ethylenediamone-triacetic acid (HEDTA) m-xylenediamine (MXDA), iminodiacetic acid (IDA), 2-(hydroxyethyl)iminodiacetic acid (HIDA), nitrilotriacetic acid, thiourea, 1,1,3,3-tetramethylurea, urea, urea derivatives, uric acid, alanine, arginine, asparagine, aspartic acid, cysteine, glutamic acid, glutamine, histidine, isoleucine, leucine, lysine, methionine, phenylalanine, proline, serine, threonine, tryptophan, tyrosine, valine, and combinations thereof. Alternatively, or in addition to the aforementioned complexing agents, additional complexing agents can include phosphonates (e.g., 1-hydroxyethylidene-1,1-diphosphonic acid (HEDP), 1,5,9-triazacyclododecane-N,N',N''-tris(methylenephosphonic acid) (DOTRP), 1,4,7,10-tetraazacyclododecane-N,N',N'',N'''-tetrakis(methylenep-hosphonic acid) (DOTP), nitrilotris(methylene)triphosphonic acid, diethylenetriaminepentakis(methylenephosphonic acid) (DETAP), aminotri(methylenephosphonic acid), bis(hexamethylene)triamine pentamethylene phosphonic acid, 1,4,7-triazacyclononane-N,N',N''-tris(methylenephosphonic acid (NOTP), hydroxyethyldiphosphonate, nitrilotris(methylene)phosphonic acid, 2-phosphono-butane-1,2,3,4-tetracarboxylic, carboxy ethyl phosphonic acid, aminoethyl phosphonic acid, glyphosate, ethylene diamine tetra(methylenephosphonic acid) phenylphosphonic acid, salts thereof, and derivatives thereof) and/or carboxylic acids (e.g., oxalic acid, succinnic acid, maleic acid, malic acid, malonic acid, adipic acid, phthalic acid, citric acid, sodium citrate, potassium citrate, ammonium citrate, tricarballylic acid, trimethylolpropionic acid, tartaric acid, glucuronic acid, 2-carboxypyridine) and/or sulfonic acids such as tiron (4,5-Dihydroxy-1,3-benzenedisulfonic acid disodium salt). In certain embodiments, the at least one complexing agent comprises a species chosen from monoethanolamine, triethanolamine, sulfuric acid, citric acid and combinations thereof. In one embodiment, the amount of complexing agent(s) in the removal composition is in a range from about 0.01 wt % to about 20 wt %, based on the total weight of the composition.

Amines suitable as etchant sources include species having the general formula $NR^4R^5R^6$, wherein $R^4$, $R^5$ and $R^6$ may be the same as or different from one another and are selected from the group consisting of hydrogen, straight-chained or branched $C_1$-$C_6$ alkyl (e.g., methyl, ethyl, propyl, butyl, pentyl, and hexyl), straight-chained or branched $C_1$-$C_6$ alcohol (e.g., methanol, ethanol, propanol, butanol, pentanol, and hexanol), and straight chained or branched ethers having the formula $R^7$—O—$R^8$, where $R^7$ and $R^8$ may be the same as or different from one another and are selected from the group consisting of $C_1$-$C_6$ alkyls as defined above. When the amine includes the ether component, the amine may be considered an alkoxyamine. Other organic amines contemplated include dicyanamide ($C_2N_3$—), as well as salts and analogs thereof. In other embodiments, at least one of $R^4$, $R^5$ and $R^6$ is a straight-chained or branched $C_1$-$C_6$ alcohol group. Examples include, without limitation, alkanolamines such as alkanolamines such as aminoethylethanolamine, N-methylaminoethanol, aminoethoxyethanol, aminoethoxyethoxyethanol, butoxypropylamine, methoxypropylamine, butoxyisopropylamine, 2-ethylhexylisopropoxyamine, ethanolpropylamine, ethylethanolamine, n-hydroxyethylmorpholine, aminopropyldiethanolamine, dimethylaminoethoxyethanol, diethanolamine, N-methyldiethanolamine, monoethanolamine, triethanolamine, piperazine, hydroxyethylpiperazine, dihyrdoxyethylpiperazine, diisopropanolamine, tris(aminoethyl)amine, 1-amino-2-propanol, 3-amino-1-propanol, diisopropylamine, aminomethylpropanediol, N,N-dimethylaminomethylpropanediol, aminoethylpropanediol, N,N-dimethylaminoethylpropanediol, isopropylamine, 2-amino-1-butanol, aminomethylpropanol, aminodimethylpropanol, N,N-dimethylaminomethylpropanol, isobutanolamine, diisopropanolamine, 3-amino,4-hydroxyoctane, 2-aminobutylanol, tris(hydroxymethyl)aminomethane (TRIS), N,N-dimethyltris(hydroxymethyl) aminomethane, hydroxyproplyamine, benzylamine, hydroxyethyl amine, tris(hydroxyethyl)aminomethane, other $C_1$-$C_8$ alkanolamines, and combinations thereof; amines such as triethylenediamine, ethylenediamine, hexamethylenediamine, tetraethylenepentamine (TEPA), triethylenetetraamine, diethylenetriamine, triethylamine, trimethylamine, and combinations thereof; diglycolamine; morpholine; and combinations of amines and alkanolamines. In one embodiment, the organic amine comprises monoethanolamine.

As used herein, the term "organic additive" refers to organic solvents which assist in solubilization of the components of the aqueous cleaning composition and organic residues, wet the surface of the microelectronic device structure to facilitate residue removal, prevent residue redeposition, and/or passivate the underlying materials, e.g., ULK. Such organic solvents contemplated herein include, but are not limited to, alcohols, ethers, pyrrolidinones, glycols, and glycol ethers, including, but not limited to, methanol, ethanol, isopropanol, butanol, and higher alcohols (such as $C_2$-$C_4$ diols and $C_2$-$C_4$ triols), tetrahydrofurfuryl alcohol (THFA), halogenated alcohols (such as 3-chloro-1, 2-propanediol, 3-chloro-1-propanethiol, 1-chloro-2-propanol, 2-chloro-1-propanol, 3-chloro-1-propanol, 3-bromo-1, 2-propanediol, 1-bromo-2-propanol, 3-bromo-1-propanol, 3-iodo-1-propanol, 4-chloro-1-butanol, 2-chloroethanol), dichloromethane, chloroform, acetic acid, propionic acid, trifluoroacetic acid, tetrahydrofuran N-methylpyrrolidinone (NMP), cyclohexylpyrrolidinone, N-octylpyrrolidinone, N-phenylpyrrolidinone, methyldiethanolamine, methyl formate, dimethyl formamide (DMF), dimethylsulfoxide (DMSO), tetramethylene sulfone (sulfolane), diethyl ether, phenoxy-2-propanol (PPh), propriophenone, ethyl lactate, ethyl acetate, ethyl benzoate, acetonitrile, acetone, ethylene glycol, propylene glycol (PG), 1,3-propanediol, dioxane, butyryl lactone, butylene carbonate, ethylene carbonate, propylene carbonate, dipropylene glycol, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether (i.e., butyl carbitol), triethylene glycol monobutyl ether, ethylene glycol monohexyl ether, diethylene glycol monohexyl ether, ethylene glycol phenyl ether, propylene glycol methyl ether, dipropylene glycol methyl ether (DPGME), tripropylene glycol methyl ether (TPGME), dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, propylene glycol phenyl ether, dipropylene glycol methyl ether acetate, tetraethylene glycol dimethyl ether (TEGDE), ethylene glycol monophenyl ether, diethyleneglycol monophenyl ether, triethyleneglycol monophenyl ether, dibasic ester, glycerine carbonate, N-formyl morpholine, triethyl phosphate, and combinations thereof. In addition, the organic solvent may comprise other amphiphilic species, i.e., species that contain both hydrophilic and hydrophobic moieties similar to surfactants. Hydrophobic properties may generally be imparted by inclusion of a molecular group consisting of hydrocarbon or fluorocarbon groups and the hydrophilic properties may generally be imparted by inclusion of either ionic or uncharged polar functional groups. In one embodiment, the organic solvent includes tripropylene glycol methyl ether (TPGME), dipropylene glycol methyl ether (DPGME), propylene glycol, and combinations thereof. In certain embodiments, the composition comprises about 0.01 wt % to about 20 wt % organic solvent or 5 wt % to 20 wt %, based on the total weight of the composition.

As used herein, the term "surfactant" refers to surfactants such as ethylene oxide/propylene oxide block copolymers such as Pluronic® P84 (BASF), CAS No. 9003-11-6; dodecyl trimethyl ammonium hydroxide, Cocamidopropyl Betaine, CAS No. 61789-40-0 (a.k.a., {[3-(Dodecanoylamino)propyl](dimethyl)ammonio}acetate); polyglycol ethers such as Servamine® KW100 (Elementis), polyglycol ether (15 EO) cocoammonium methosulfate; and fatty amine quaternary ammonium salts such as Cirrasol™ G265 (Croda); and combinations thereof.

Suitable corrosion inhibitors in the context of the present invention decrease the corrosion rate of a metal; classes of corrosion inhibitors may include but are not limited to: 1. molecules that bind, adsorb, coat or react to/with the metal surface and provide a barrier for the transport of oxygen or water to the metal surface or prevent the transmission of oxidized metal cations out of the surface; 2. molecules that change the electrochemical surface potential of a metal and make it more noble; and 3. molecules that sacrificially scavenge oxygen or acids that increase corrosion rate. Exemplary corrosion inhibitors include compounds such as triazoles and derivatives thereof, benzotriazoles and derivatives thereof, tolyltriazole, thiazoles and derivatives thereof, tetrazoles and derivatives thereof, imidazoles and derivatives thereof, and azines and derivatives thereof. Exemplary corrosion inhibitors include 5-aminotetrazole, 5-phenyl-benzotriazole, 1H-tetrazole-5-acetic acid, 1-phenyl-2-tetrazoline-5-thione, benzimidazole, methyltetrazole, Bismuthiol I, cytosine, guanine, thymine, pyrazoles, iminodiacetic acid (IDA), propanethiol, benzohydroxamic acids, citric acid, ascorbic acid, 5-amino-1,3,4-thiadiazole-2-thiol (ATDT), benzotriazole (BTA), 1,2,4-triazole (TAZ), tolyltriazole, 5-methyl-benzotriazole (mBTA), 5-phenyl-benzotriazole, 5-nitro-benzotriazole, benzotriazole carboxylic acid, 3-amino-5-mercapto-1,2,4-triazole, 1-amino-1,2,4-triazole, hydroxybenzotriazole, 2-(5-amino-pentyl)-benzotriazole, 1-amino-1,2,3-triazole, 1-amino-5-methyl-1,2,3-triazole, 3-amino-1,2,4-triazole (3-ATA), 3-mercapto-1,2,4-triazole, 3-isopropyl-1,2,4-triazole, 5-phenylthiol-benzotriazole, halo-benzotriazoles (halo=F, Cl, Br or I), naphthotriazole, 2-mercaptobenzimidazole (MBI), 2-mercaptobenzothiazole, 4-methyl-2-phenylimidazole, 2-mercaptothiazoline, 5-amino-1,2,4-triazole (5-ATA), sodium dedecyl sulfate (SDS), ATA-SDS, 3-amino-5-mercapto-1,2,4-triazole, pentylenetetrazole, 5-phenyl-1H-tetrazole, 5-benzyl-1H-tetrazole, Ablumine O, 2-benzylpyridine, succinimide, 2,4-diamino-6-methyl-1,3,5-triazine, thiazole, triazine, methyltetrazole, 1,3-dimethyl-2-imidazolidinone, 1,5-pentamethylenetetrazole, 1-phenyl-5-mercaptotetrazole, diaminomethyltriazine, imidazoline thione, 4-methyl-4H-1, 2,4-triazole-3-thiol, 4-amino-4H-1,2,4-triazole, 3-amino-5-methylthio-1H-1,2,4-triazole, benzothiazole, imidazole, indiazole, adenine, succinimide, adenosine, carbazole, saccharin, uric acid, benzoinoxime, cationic quaternary salts (e.g., benzalkonium chloride, benzyldimethyldodecylammonium chloride, myristyltrime thylammonium bromide, dodecyltrimethylammonium bromide, hexadecylpyridinium chloride, Aliquot 336 (Cognis), benzyldimethylphenylammonium chloride, Crodaquat TES (Croda. Inc.), Rewoquat CPEM (Witco), hexadecyltrimethylammonium p-toluenesulfonate, hexadecyltrimethylammonium hydroxide, 1-methyl-1'-tetradecyl-4,4'-bipyridium dichloride, alkyltrimethylammonium bromide, amprolium hydrochloride, benzethonium hydroxide, benzethonium chloride, benzylditnethylhexadecylammonium chloride, benzyldimethyltetradecylammonium chloride, benzyldodecyldimethylammonium bromide, benzyldodecyldimethylammonium chloride, cetylpyridinium chloride, choline p-toluenesulfonate salt, dimethyldioctadecylammonium bromide, dodecylethyldimethylammonium bromide, dodecyltrimethylammonium chloride, ethylhexadecyldimethylammonium bromide, Girard's reagent, hexadecyl(2-hydroxyethyl)dimethylammonium dihydrogen phosphate, dexadecylpyridinium bromide, hexadecyltrimethylammonium bromide, hexadecyltrimethylammonium chloride, methylbenzethonium chloride, Hyamine® 1622, Luviquat™, N,N',N'-polyoxyethylene (10)-N-tallow-1,3-diaminopropane liquid, oxyphenonium bromide, tetraheptylammonium bromide, tetrakis(decyl)ammonium bromide, thonzonium bromide, tridodecylammonium chloride, trimethyloctadecylammonium bromide, 1-methyl-3-n-octylimidazolium tetrafluoroborate, 1-decyl-3-methylimidazolium tetrafluoroborate. 1-decyl-3-methylimidazolium chloride, tridodecylmethylammonium bromide, dimethyldistearylammonium chloride, cetyltrimethylammonium bromide, myristyltrimethylammonium bromide, and hexamethonium chloride), anionic surfactants (e.g., dodecylbenzenesulfonic acid, sodium dodecylbenzenesulfonate, dodecylphosphonic acid (DDPA), steroyl sarcosine, laurylsarcosine, Surfynol® 104 (tetramethyl decynediol, Evonik), propargyl alcohol, dicyandiamide, dimethylpropargyl alcohol, saccharaine, diethylhydroxylamine, hydroxylamine, diethylhydroxylamine, 2-mercapto-2-thiazoline, mercapthiadiazole, aminomercaptothiadiazole, dimercaptothiadiazole, 3-methylpyrazoline-5-one and combinations thereof.

As used herein, "suitability" for cleaning residue and contaminants from a microelectronic device having said residue and contaminants thereon corresponds to at least partial removal of said residue/contaminants from the microelectronic device. Cleaning efficacy is rated by the reduction of objects on the microelectronic device. For example, pre- and post-cleaning analysis may be carried out using an atomic force microscope. The particles on the sample may be registered as a range of pixels. A histogram (e.g., a Sigma Scan Pro) may be applied to filter the pixels in a certain intensity, e.g., 231-235, and the number of particles counted. The particle reduction may be calculated using:

$$\text{Cleaning Efficacy} = \frac{\left(\begin{array}{c}\text{Number of } \textit{PreClean} \text{ Objects} - \\ \text{Number of } \textit{PostClean} \text{ Objects}\end{array}\right)}{\text{Number of } \textit{PreClean} \text{ Objects}} \times 100$$

Notably, the method of determination of cleaning efficacy is provided for example only and is not intended to be limited to same. Alternatively, the cleaning efficacy may be considered as a percentage of the total surface that is covered by particulate matter. For example, AFM's may be programmed to perform a z-plane scan to identify topographic areas of interest above a certain height threshold and then calculate the area of the total surface covered by said areas of interest. One skilled in the art would readily understand that the less area covered by said areas of interest post-cleaning, the more efficacious the cleaning composition. In one embodiment, at least 75% of the residue/contaminants are removed from the microelectronic device using the compositions described herein, in other embodiments, at least 90%, at least 95%, or at least 99% of the residue/contaminants are removed.

Compositions described herein may be embodied in a wide variety of specific formulations, as hereinafter more fully described.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed. As used herein, "substantially devoid" means less than 2 wt. %, less than 1 wt. %, less than 0.5 wt. %, or less than 0.1 wt. %. In one embodiment, "substantially devoid" corresponds to zero percent. The cleaning compositions of the invention may be substantially devoid, or devoid, of at least one oxidizing agent; fluoride-containing sources; and abrasive materials.

Polymers, when present include but are not limited to methacrylic acid homopolymer and copolymers with, for example, acrylamidomethylpropane sulfonic acid and maleic acid; maleic acid/vinyl ether copolymer; poly(vinylpyrrolidone)/vinyl acetate; homopolymers such as phosphonated polyethyleneglycol oligomers, poly(acrylic acid) (PAA), poly(acrylamide), poly(vinyl acetate), poly(ethylene glycol) (PEG), polypropylene glycol) (PPG), poly(styrene sulfonic acid), poly(vinyl sulfonic acid), poly(vinyl phosphonic acid), poly(vinyl phosphoric acid), poly(ethyleneimine), poly(propyleneimine), polyallylamine, polyethylene oxide (PEO), polyvinyl pyrrolidone (PVP), PPG-PEG-PPG block copolymers, PEG-PPG-PEG block copolymers, poly (vinyl alcohol), poly(hydroxyethyl)acrylate, poly(hydroxyethyl)methacrylate, hydroxyethyl cellulose, methylhydroxyethyl cellulose, hydroxypropyl cellulose, methylhydroxypropyl cellulose, xanthan gum, potassium alginate, calcium alginate, pectin, carboxymethylcellulose, potassium carboxymethylcellulose, glucosamine, poly(diallyldimethylammonium) chloride, PEGylated (i.e., polyethyleneglycol-ated) methacrylate/acrylate copolymers, poly MADQuat and copolymers thereof, dimethylaminomethacrylate polymers and compolymers thereof, trimethylammonium methylmethacrylate polymers and copolymers thereof, and combinations thereof. The copolymers above may be random or block copolymers. When present, the amount of polymer(s) in the composition is in a range from about 0.0001 weight % to about 5 weight %, based on the total weight of the composition.

In certain embodiments, the pH of the composition is greater than 8, greater than 9, greater than 10 or greater than 11, less than 14, less than 13, less than 12, or less than 11. In certain embodiments, the pH is about 8 to 11.5; after dilution, the pH in certain embodiments is greater than 7, greater than 8, greater than 9 or greater than 10, less than 13, less than 12, or less than 11. In certain embodiments, the pH of the diluted composition is about 8 to 12.

The compositions are easily formulated by simple addition of the respective ingredients and mixing to homogeneous condition. Furthermore, the compositions may be readily formulated as single-package formulations or multi-part formulations that are mixed at or before the point of use, e.g., the individual parts of the multi-part formulation may be mixed at the tool or in a storage tank upstream of the tool. The concentrations of the respective ingredients may be widely varied in specific multiples of the composition, i.e., more dilute or more concentrated, and it will be appreciated that the compositions described herein can variously and alternatively comprise, consist or consist essentially of any combination of ingredients consistent with the disclosure herein.

As noted herein, the compositions have a pH of greater than 8. A pH adjuster is utilized to raise the pH to the desired level. Suitable pH adjusting agents include alkali metal hydroxides (e.g., LiOH, KOH, RbOH, CsOH), alkaline earth metal hydroxides (e.g., Be(OH)$_2$, Mg(OH)$_2$, Ca(OH)$_2$, Sr(OH)$_2$, Ba(OH)$_2$), and compounds having the formula NR$^9$R$^{10}$R$^{11}$R$^{12}$OH, wherein R$^9$, R$^{10}$, R$^{11}$ and R$^{12}$ may be the same as or different from one another and are chosen from hydrogen, straight-chained or branched C$_2$-C$_6$ alkyl (e.g., ethyl, propyl, butyl, pentyl, and hexyl), C$_1$-C$_6$ alkoxy (e.g., methoxy, ethoxy, propoxy, butoxy, pentoxy, hexoxy), and substituted or unsubstituted C$_6$-C$_{10}$ aryl, e.g., benzyl, wherein R$^9$, R$^{10}$, R$^{11}$, R$^{12}$ are not all methyl groups. Tetraalkylammonium hydroxides that are commercially available include tetraethylammonium hydroxide (TEAH), tetrapropylammonium hydroxide (TPAH), tetrabutylammonium hydroxide (TBAH), tributylmethylammonium hydroxide (TBMAH), benzyltrimethylammonium hydroxide (BTMAH), choline hydroxide, ethyltrimethylammonium hydroxide, tris(2-hydroxyethyl)methyl ammonium hydroxide, diethyldimethylammonium hydroxide, triethylmethylammonium hydroxide, trishydroxyethylmethyl Ammonium Hydroxide, and combinations thereof, may be used. Alternatively or in addition, the at least pH adjusting agent can be a compound of the formula (PR$^{13}$R$^{14}$R$^{15}$R$^{16}$)OH, wherein R$^{13}$, R$^{14}$, R$^{13}$, and R$^{16}$ may be the same as or different from one another and are chosen from hydrogen, straight-chained C$_1$-C$_6$ alkyl (e.g., methyl, ethyl, propyl, butyl, pentyl, hexyl), branched C$_1$-C$_6$ alkyl, C$_1$-C$_6$ alkoxy (e.g., methoxy, ethoxy, propoxy, butoxy, pentoxy, hexoxy), substituted C$_6$-C$_{10}$ aryl, unsubstituted C$_6$-C$_{10}$ aryl (e.g., benzyl), and any combination thereof, such as tetrabutylphosphonium hydroxide (TBPH), tetramethylphosphonium hydroxide, tetraethylphosphonium hydroxide, tetrapropylphosphonium hydroxide, benzyltriphenylphosphonium hydroxide, methyl triphenylphosphonium hydroxide, ethyl triphenylphosphonium hydroxide, N-propyl triphenylphosphonium hydroxide. In one embodiment, the pH adjusting agent comprises KOH. In another embodiment, the pH adjusting agent comprises choline hydroxide. In another embodiment, the pH adjusting agent comprises at least one alkali metal hydroxide and at least one additional hydroxide enumerated herein. In another embodiment, the pH adjusting agent comprises KOH and at least one additional hydroxide enumerated herein. In still another embodiment, the pH adjusting agent comprises KOH and choline hydroxide.

In certain embodiments, the compositions of the invention are comprised of the following components in the proportions (by weight) listed below:
(i) at least one etchant material at concentrations between 0.01-20%, chosen from amines and complexing agents,
(ii) at least one cleaning additive chosen from certain surfactants,
(iii) at least one organic additive material at concentrations between 0.01-20%,
(iv) at least one corrosion inhibitor material at concentrations between 0.01-20%,
(v) at least one pH adjuster, and optionally
(vi) at least one water soluble polymer material at concentrations between 0.001-10%, The range of weight percent ratios of the components will cover all possible concentrated or diluted embodiments of the compositions of the first aspect. Towards that end, in one embodiment, a concentrated cleaning composition is provided that can be diluted for use as a cleaning solution. A concentrated cleaning composition, or "concentrate," advantageously permits a user, e.g., CMP process engineer, to dilute the concentrate to the desired strength and pH at the point of use. Dilution of the concentrated cleaning composition may be in a range from about 1:1 to about 2500:1, about 10:1 to about 200:1, or about 30:1 to about 150:1, wherein the cleaning composition is diluted at or just before the tool with solvent, e.g., deionized water. It is to be appreciated by one skilled in the art that following dilution, the range of weight percent ratios of the components disclosed herein should remain unchanged.

The cleaning compositions described herein are easily formulated by simple addition of the respective ingredients and mixing to homogeneous condition. Furthermore, the compositions may be readily formulated as single-package formulations or multi-part formulations that are mixed at or before the point of use, e.g., the individual parts of the multi-part formulation may be mixed at the tool or in a storage tank upstream of the tool. The concentrations of the respective ingredients may be widely varied in specific multiples of the composition, i.e., more dilute or more concentrated, and it will be appreciated that the compositions described herein can variously and alternatively comprise, consist or consist essentially of any combination of ingredients consistent with the disclosure herein.

Accordingly, another aspect of the invention relates to a kit including, in one or more containers, one or more components adapted to form the compositions described herein. The kit may include, in one or more containers, a kit comprising one or more containers having components therein suitable for cleaning a microelectronic surface comprising copper, low-k dielectric materials, and barrier materials comprising at least one of tantalum-containing material, cobalt-containing material, and ruthenium-containing material, wherein one or more containers of said kit contains at A kit comprising one or more containers having components therein suitable chemical mechanical polishing (CMP) contaminants and residues from a microelectronic device having said CMP contaminants and residues thereon, wherein one or more containers of said kit contains
(i) at least one etchant material chosen from amines and complexing agents,
(ii) at least one cleaning additive chosen from ethylene oxide/propylene oxide block copolymers, dodecyl trimethyl ammonium hydroxide, Cocamidopropyl Betaine, polyglycol ethers, and fatty amine quaternary ammonium salts, and combinations thereof,
(iii) at least one organic additive,
(iv) at least one corrosion inhibitor,
(v) at least one pH adjuster, and optionally
(vi) at least one water soluble polymer;
and water for combining with additional solvent and/or water at the fab or the point of use. The containers of the kit must be suitable for storing and shipping the compositions and may be, for example, NOWPak® containers (Entegris, Inc., Billerica, Mass., USA).

In one embodiment, the one or more containers which contain the components of the aqueous removal composition include means for bringing the components in said one or more containers in fluid communication for blending and dispense. For example, referring to the NOWPak® containers, gas pressure may be applied to the outside of a liner in said one or more containers to cause at least a portion of the contents of the liner to be discharged and hence enable fluid communication for blending and dispense. Alternatively, gas pressure may be applied to the head space of a conventional pressurizable container or a pump may be used to enable fluid communication. In addition, in certain embodiments the system includes a dispensing port for dispensing the blended removal composition to a process tool.

As applied to microelectronic manufacturing operations, the compositions described herein are usefully employed to clean ceria particles and/or CMP contaminants (e.g., post- CMP residue and contaminants) from the surface of the microelectronic device. In certain embodiments, the aqueous removal compositions remove at least 85% of the ceria particles present on the device prior to particle removal, at least 90%, at least 95%, or at least 99%.

In post-CMP particle and contaminant removal applications, the aqueous removal composition described herein may be used with a large variety of conventional cleaning tools such as megasonics and brush scrubbing, including, but not limited to, Verteq single wafer megasonic Goldfinger, OnTrak systems DDS (double-sided scrubbers), SEZ or other single wafer spray rinse, Applied Materials Mirra-Mesa™/Reflexion™/Reflexion LK™, and Megasonic batch wet bench systems.

In the use of the compositions provided herein, the aqueous removal composition typically is contacted with the device for a time of from about 5 seconds to about 10 minutes, or about 1 sec to 20 min, or about 15 sec to about 5 minutes at temperature in a range of from about 20° C. to about 90° C., or about 20° C. to about 50° C. Such contacting times and temperatures are illustrative, and any other suitable time and temperature conditions may be employed that are efficacious to at least partially remove the ceria particles and CMP contaminants from the device, within the broad practice of the method. "At least partially clean" and "substantial removal" both correspond in certain embodiments to at removal of at least 85% of the silica, alumina, ceria, titania or zirconia particles present on the device prior to particle removal, at least 90%, at least 95%, or at least 99%.

Following the achievement of the desired silica, alumina, ceria, titania or zirconia particle removal action, the aqueous removal composition may be readily removed from the device to which it has previously been applied, as may be desired and efficacious in a given end use application of the compositions described herein. In one embodiment, the rinse solution includes deionized water. Thereafter, the device may be dried using nitrogen or a spin-dry cycle.

Yet another aspect relates to the improved microelectronic devices made according to the methods described herein and to products containing such microelectronic devices.

Another aspect relates to a recycled aqueous removal composition, wherein the removal composition may be recycled until particle and/or contaminant loading reaches the maximum amount the aqueous removal composition may accommodate, as readily determined by one skilled in the art.

A still further aspect relates to methods of manufacturing an article comprising a microelectronic device, said method comprising contacting the microelectronic device with an aqueous removal composition for sufficient time to remove silica, alumina, ceria, titania or zirconia particles and other CMP contaminants from the microelectronic device having said particles and contaminants thereon, and incorporating said microelectronic device into said article, using a removal composition described herein.

In another aspect, a method of removing silica, alumina, ceria, titania or zirconia particles and other CMP contaminants from a microelectronic device having same thereon is provided. Accordingly, in another aspect, the invention provides a method for removing ceria particles and chemical mechanical polishing contaminants from a microelectronic device having said particles and contaminants thereon, said method comprising:
(i) contacting the microelectronic device with the composition of the invention; and
(ii) at least partially removing said particles and contaminants from said microelectronic device with an aqueous solution comprising the compositions of the invention.

This invention can be further illustrated by the following examples of preferred embodiments thereof, although it will be understood that these examples are included merely for purposes of illustration and are not intended to limit the scope of the invention unless otherwise specifically indicated.

EXPERIMENTAL SECTION

Figure 2:
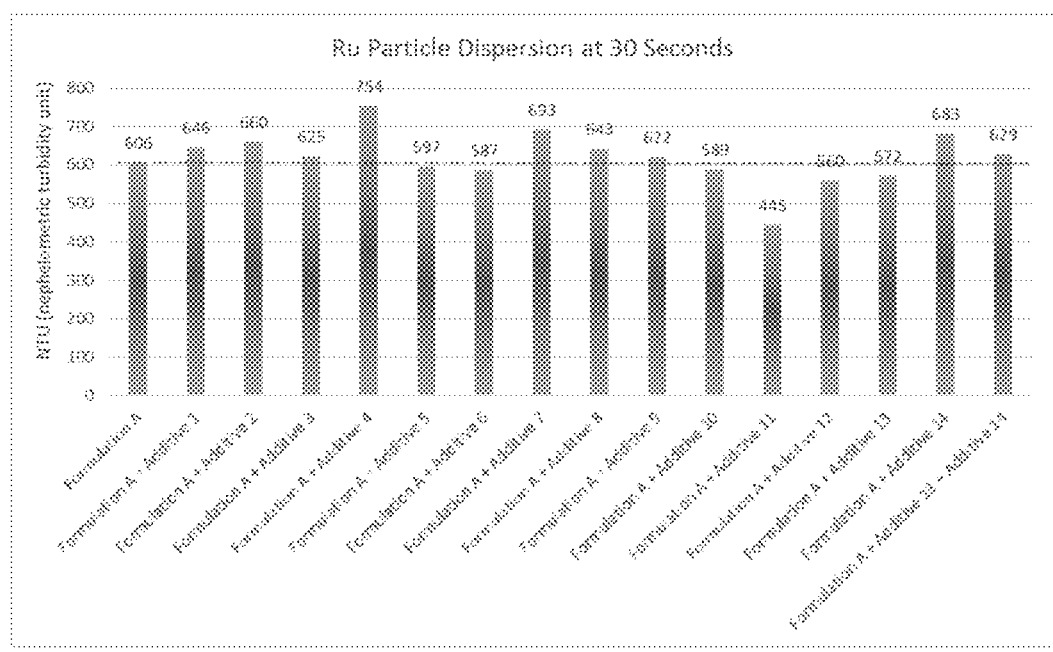

A solution of metal particles in DI water was rolled up to 10 minutes before it was introduced into a pCMP cleaning chemistry at desired dilution ratio. The vial holding cleaning chemistry mixed with metal particles was then thoroughly shaked for 1 minute. Turbidity measurement was conducted every 30 seconds for up to 5 minutes to detect dispersion capability of metal particles in pCMP cleaning chemistry. The higher turbidity values, the better metal particle dispersion capability. As shown in FIG. 1, Additive 4-14 improved cobalt particle dispersion when added into Formulation A. Additive 1, 2, 4, 7, 8, 9, and 14 enhanced ruthenium particle dispersion, shown in FIG. 2.

Formulation A consists of
Tetraethylammonium hydroxide (adjusting pH to 13.5)
9% Ethanolamine (complexer)
0.1% benzotriazole (corrosion inhibitor)
Additive 1 is Pluronic L31,
Additive 2 is Pluronic P84,
Additive 3 is Pluronic F127,
Additive 4 is Isostearyl Ethylimidazolinium Ethosulfate,
Additive 5 is Cocamidopropyl Betaine
Additive 6 is Servamine KW100
Additive 7 is SPAN 80
Additive 8 is TWEEN 40
Additive 9 is TWEEN 80
Additive 10 is TRITON X100
Additive 11 is TRITON X114
Additive 12 is Polyvinylpyrrolidone
Additive 13 is Poly(vinyl Alcohol)
Additive 14 is Potassium Alginate

The invention claimed is:

1. A composition comprising
(i) at least one etchant material chosen from amines and complexing agents,
(ii) at least one cleaning additive chosen from ethylene oxide/propylene oxide block copolymers, dodecyl trimethyl ammonium hydroxide, Cocamidopropyl Betaine, polyglycol ethers, and fatty amine quaternary ammonium salts, and combinations thereof,
(iii) at least one organic additive,
(iv) at least one corrosion inhibitor,
(v) at least one pH adjuster, and optionally
(vi) at least one water soluble polymer,
wherein said composition has a pH of greater than about 8.

2. The composition of claim 1, wherein the pH is about 8 to about 14.

3. The composition of claim 1, wherein the pH is about 9 to about 13.9.

4. The composition of claim 1, wherein the etchant material is chosen from monoethanolamine, diglycolamine, and dimethanolamine.

5. The composition of claim 1, wherein the etchant material is chosen from compounds of the formula $NR^1R^2R^3$, wherein $R^1$, $R^2$ and $R^3$ may be the same as or different from one another and are chosen from hydrogen, straight-chain or branched $C_1$-$C_6$ alkyl groups, straight-chain or branched $C_1$-$C_6$ hydroxyalkyl groups, and $C_1$-$C_6$ alkyl ethers of straight chain or branched $C_1$-$C_6$ hydroxyalkyl groups.

6. The composition of claim 1, wherein the etchant material is chosen from aminoethylethanolamine, N-methylaminoethanol, aminoethoxyethanol, dimethylaminoethoxyethanol, diethanolamine, diglycolamine, N-methyldiethanolamine, monoethanolamine (MEA), triethanolamine (TEA), 1-amino-2-propanol, 2-amino-1-butanol, isobutanolamine, triethylenediamine, 1-methoxy-2-aminoethane, and combinations thereof.

7. The composition of claim 1, wherein the etchant material is chosen from 4-(2-hydroxyethyl)morpholine (HEM), 1,2-cyclohexanediamine-N,N,N',N'-tetraacetic acid (CDTA), ethylenediaminetetraacetic acid (EDTA), m-xylenediamine (MXDA), iminodiacetic acid (IDA), 2-(hydroxyethyl)iminodiacetic acid (HIDA), nitrilotriacetic acid, thiourea, 1,1,3,3-tetramethylurea, urea, uric acid, alanine, arginine, asparagine, aspartic acid, cysteine, glutamic acid, glutamine, histidine, isoleucine, leucine, lysine, methionine, phenylalanine, proline, serine, threonine, tryptophan, tyrosine, valine, and combinations thereof.

8. The composition of claim 1, wherein the etchant material is chosen from 1-hydroxyethylidene-1,1-diphosphonic acid (HEDP), 1,5,9-triazacyclododecane-N,N',N''-tris(methylenephosphonic acid) (DOTRP), 1,4,7,10-tetraazacyclododecane-N,N',N'',N'''-tetrakis(methylenephosphonic acid) (DOTP), nitrilotris(methylene) triphosphonic acid, diethylenetriaminepentakis (methylenephosphonic acid) (DETAP), aminotri (methylenephosphonic acid), bis(hexamethylene)triamine pentamethylene phosphonic acid, 1,4,7-triazacyclononane-N,N',N''-tris(methylenephosphonic acid (NOTP), hydroxyethyldiphosphonate, nitrilotris(methylene)phosphonic acid, 2-phosphono-butane-1,2,3,4-tetracarboxylic, carboxy ethyl phosphonic acid, aminoethyl phosphonic acid, glyphosate, ethylene diamine tetra(methylenephosphonic acid), phosphoric acid, phenylphosphonic acid, and salts thereof.

9. The composition of claim 1, wherein the cleaning additive is dodecyl trimethyl ammonium hydroxide.

10. The composition of claim 1, wherein the cleaning additive is Cocamidopropyl Betaine.

11. The composition of claim 1, wherein the cleaning additive is polyglycol ether (15 EO) cocoammonium methosulfate.

12. The composition of claim 1, wherein the cleaning additive is a fatty amine quaternary ammonium salt.

13. The composition of claim 1, wherein the organic additive is chosen from alcohols, ethers, pyrrolidinones, glycols, amines, and glycol ethers.

14. The composition of claim 1, wherein the organic additive is chosen from methanol, ethanol, isopropanol, butanol, $C_2$-$C_4$ diols, $C_2$-$C_4$ triols, tetrahydrofurfuryl alcohol (THFA), 3-chloro-1,2-propanediol, 3-chloro-1-propanethiol, 1-chloro-2-propanol, 2-chloro-1-propanol, 3-chloro-1-propanol, 3-bromo-1,2-propanediol, 1-bromo-2-propanol, 3-bromo-1-propanol, 3-iodo-1-propanol, 4-chloro-1-butanol, 2-chloroethanol), dichloromethane, chloroform, acetic acid, propionic acid, trifluoroacetic acid, tetrahydrofuran N-methylpyrrolidinone (NMP), cyclohexylpyrrolidinone, N-octylpyrrolidinone, N-phenylpyrrolidinone, methyldiethanolamine, methyl formate, dimethyl formamide (DMF), dimethylsulfoxide (DMSO), tetramethylene sulfone (sulfolane), diethyl ether, phenoxy-2-propanol (PPh), ethylene glycol monophenyl ether, diethylene glycol monophenyl ether, propriophenone, ethyl lactate, ethyl acetate, ethyl benzoate, acetonitrile, acetone, ethylene glycol, propylene glycol (PG), 1,3-propanediol, dioxane, butyryl lactone, butylene carbonate, ethylene carbonate, propylene carbonate, dipropylene glycol, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether, triethylene glycol monobutyl ether, ethylene glycol monohexyl ether, diethylene glycol monohexyl ether, ethylene glycol phenyl ether, propylene glycol methyl ether, dipropylene glycol methyl ether (DPGME), tripropylene glycol methyl ether (TPGME), dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, propylene glycol phenyl ether, dipropylene glycol methyl ether acetate, tetraethylene glycol dimethyl ether (TEGDE), dibasic ester, glycerine carbonate, N-formyl morpholine, triethyl phosphate, and combinations thereof.

15. The composition of claim 1, wherein the organic additive is chosen from tripropylene glycol methyl ether (TPGME), dipropylene glycol methyl ether (DPGME), propylene glycol, and combinations thereof.

16. The composition of claim 1, wherein the corrosion inhibitor is chosen from: 5-aminotetrazole, 5-phenyl-benzotriazole, 1H-tetrazole-5-acetic acid, 1-phenyl-2-tetrazoline-5-thione, benzimidazole, methyltetrazole, Bismuthiol I, cytosine, guanine, thymine, pyrazoles, iminodiacetic acid (IDA), propanethiol, benzohydroxamic acids, citric acid, ascorbic acid, 5-amino-1,3,4-thiadiazole-2-thiol (ATDT), benzotriazole (BTA), 1,2,4-triazole (TAZ), tolyltriazole, 5-methyl-benzotriazole (mBTA), 5-phenyl-benzotriazole, 5-nitro-benzotriazole, benzotriazole carboxylic acid, 3-amino-5-mercapto-1,2,4-triazole, 1-amino-1,2,4-triazole, hydroxybenzotriazole, 2-(5-amino-pentyl)-benzotriazole, 1-amino-1,2,3-triazole, 1-amino-5-methyl-1,2,3-triazole, 3-amino-1,2,4-triazole (3-ATA), 3-mercapto-1,2,4-triazole, 3-isopropyl-1,2,4-triazole, 5-phenylthiol-benzotriazole, halo-benzotriazoles (halo=F, Cl, Br or I), naphthotriazole, 2-mercaptobenzimidazole (MBI), 2-mercaptobenzothiazole, 4-methyl-2-phenylimidazole, 2-mercaptothiazoline, 5-amino-1,2,4-triazole (5-ATA), sodium dedecyl sulfate (SDS), ATA-SDS, 3-amino-5-mercapto-1,2,4-triazole, pentylenetetrazole, 5-phenyl-1H-tetrazole, 5-benzyl-1H-tetrazole, Ablumine O, 2-benzylpyridine, succinimide, 2,4-diamino-6-methyl-1,3,5-triazine, thiazole, triazine, methyltetrazole, 1,3-dimethyl-2-imidazolidinone, 1,5-pentamethylenetetrazole, 1-phenyl-5-mercaptotetrazole, diaminomethyltriazine, imidazoline thione, 4-methyl-4H-1,2,4-triazole-3-thiol, 4-amino-4H-1,2,4-triazole, 3-amino-5-methylthio-1H-1,2,4-triazole, benzothiazole, imidazole, indiazole, adenine, succinimide, adenosine, carbazole, saccharin, uric acid, benzoinoxime, cationic quaternary salts (e.g., benzalkonium chloride, benzyldimethyldodecylammonium chloride, myristyltrime thylammonium bromide, dodecyltrimethylammonium bromide, hexadecylpyridinium chloride, Aliquot 336, benzyldimethylphenylammonium chloride, Crodaquat TES, Rewoquat CPEM, hexadecyltrimethylammonium p-toluenesulfonate, hexadecyltrimethylammonium hydroxide, 1-methyl-1'-tetradecyl-4,4'-bipyridium dichloride, alkyltrimethylammonium bromide, amprolium hydrochloride, benzethonium hydroxide, benzethonium chloride, benzylditnethylhexadecylammonium chloride, benzyldimethyltetradecylammonium chloride, benzyldodecyldimethylammonium bromide, benzyldodecyldimethylammonium chloride, cetylpyridinium chloride, choline p-toluenesulfonate salt, dimethyldioctadecylammonium bromide, dodecylethyldime thylammonium bromide, dodecyltrimethylammonium chloride, ethylhexadecyldimethylammonium bromide, Girard's reagent, hexadecyl(2-hydroxyethyl)dimethylammonium dihydrogen phosphate, dexadecylpyridinium bromide, hexadecyltrimethylammonium bromide, hexadecyltrimethylammonium chloride, methylbenzethonium chloride, Hyamine® 1622, Luviquat™, N,N',N'-polyoxyethylene (10)-N-tallow-1,3-diaminopropane liquid, oxyphenonium bromide, tetraheptylammonium bromide, tetrakis(decyl)ammonium bromide, thonzonium bromide, tridodecylammonium chloride, trimethyloctadecylammonium bromide, 1-methyl-3-n-octylimidazolium tetrafluoroborate, 1-decyl-3-methylimidazolium tetrafluoroborate, 1-decyl-3-methylimidazolium chloride, tridodecylmethylammonium bromide, dimethyldistearylammonium chloride, cetyltrimethylammonium bromide, myristyltrimethylammonium bromide, and hexamethonium chloride), dodecylbenzenesulfonic acid, sodium dodecylbenzenesulfonate, dodecylphosphonic acid (DDPA), steroyl sarcosine, laurylsarcosine, tetramethyl decynediol, propargyl alcohol, dicyandiamide, dimethylpropargyl alcohol, saccharaine, diethylhydroxylamine, hydroxylamine, diethylhydroxylamine, 2-mercapto-2-thiazoline, mercapthiadiazole, aminomercaptothiadiazole, dimercaptothiadiazole, 3-methylpyrazoline-5-one, and combinations thereof.

17. The composition of claim 1, wherein the corrosion inhibitor is chosen from aminotriazole, triazole, saccharine, steroyl sarcosine, laurylsarcosine, dicyandiamide, cysteine, adenosine, adenine, and diethylpropargyl alcohol.

18. A composition comprising
(i) at least one etchant material comprising monoethanolamine,
(ii) at least one cleaning additive chosen from ethylene oxide/propylene oxide block copolymers, dodecyl trimethyl ammonium hydroxide, Cocamidopropyl Betaine, polyglycol ethers, and fatty amine quaternary ammonium salts, and combinations thereof,
(iii) at least one organic additive chosen from triethyleneglycol monobutyl ether, diethyleneglycol monobutyl ether, ethylene glycol monobutyl ether, propylene glycol monobutyl ether, propylene glycol monobutyl ether, propylene glycol monophenylethyl ether, diethylene glycol monophenyl ether, ethylene glycol monophenyl ether, and dimethylsulfoxide,
(iv) benzotriazole,
(v) at least one pH adjuster, and optionally
(vi) at least one water soluble polymer,
wherein said composition has a pH of greater than about 8.

19. A method for removing ceria particles and chemical mechanical polishing contaminants from a microelectronic device having said particles and contaminants thereon, said method comprising:
(i) contacting the microelectronic device with the composition of claim 1; and
(ii) at least partially removing said particles and contaminants from said microelectronic device with an aqueous solution comprising the compositions of the invention.

* * * * *